(12) United States Patent
Wang et al.

(10) Patent No.: US 12,740,446 B2
(45) Date of Patent: Sep. 15, 2026

(54) SEMICONDUCTOR PACKAGE AND METHOD OF FABRICATING SEMICONDUCTOR PACKAGE

(71) Applicant: Taiwan Semiconductor Manufacturing Company, Ltd., Hsinchu (TW)

(72) Inventors: Wei-Ming Wang, Taichung City (TW); Yu-Hung Lin, Taichung City (TW); Shih-Peng Tai, Hsinchu County (TW); Kuo-Chung Yee, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1011 days.

(21) Appl. No.: 17/737,998

(22) Filed: May 5, 2022

(65) Prior Publication Data

US 2023/0361048 A1 Nov. 9, 2023

(51) Int. Cl.
*H10W 70/65* (2026.01)
*H10W 20/00* (2026.01)
(Continued)

(52) U.S. Cl.
CPC ......... *H10W 70/65* (2026.01); *H10W 20/033* (2026.01); *H10W 20/084* (2026.01);
(Continued)

(58) Field of Classification Search
CPC ............. H01L 23/3135; H01L 23/5386; H01L 25/0652; H01L 25/0756; H01L 2224/023; H10W 70/65; H10W 20/033; H10W 20/084; H10W 20/089; H10W 70/611; H10W 74/016; H10W 74/121; H10W 90/00; H10W 70/60; H10W 90/401; H10W 90/792; H10W 90/794; H10W 80/00;
(Continued)

(56) References Cited

U.S. PATENT DOCUMENTS 5,091,769 A * 2/1992 Eichelberger ...... G01R 31/2863 257/723
5,108,825 A * 4/1992 Wojnarowski .......... C08L 63/00 428/209

(Continued)

*Primary Examiner* — Uzma Alam
(74) *Attorney, Agent, or Firm* — JCIPRNET

(57) ABSTRACT

A semiconductor package includes a substrate, a first die, a second die, a resistant layer, an encapsulant and an interlink structure. The first die has a first thickness larger than a second thickness of the second die. The resistant layer is disposed on the first and second dies and conformally covers the first and second dies. The encapsulant is disposed on the resistant layer and wraps around the first and second dies. The interlink structure is disposed above the first and second dies and embedded in the encapsulant, and the interlink structure is electrically connected with the first and second dies. The interlink structure includes a first via portion vertically extending through the encapsulant and connected to the first die, a second via portion extending vertically through the encapsulant and connected to the second die, and a routing line portion disposed on and connected with the first and second via portions, and the first via portion is shorter than the second via portion.

20 Claims, 12 Drawing Sheets

(51) Int. Cl.

| | |
|---|---|
| ***H10W 70/60*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ........ *H10W 20/089* (2026.01); *H10W 70/611* (2026.01); *H10W 74/016* (2026.01); *H10W 74/121* (2026.01); *H10W 90/00* (2026.01); *H10W 70/60* (2026.01); *H10W 90/401* (2026.01); *H10W 90/792* (2026.01); *H10W 90/794* (2026.01)

(58) Field of Classification Search

CPC ............. H10W 90/288; H10W 90/297; H10W 70/093; H10W 70/685; H10W 72/823; H10W 74/117; H10W 90/701; H10W 74/137; H10W 74/141; H10W 74/43

USPC .......................................................... 257/774

See application file for complete search history.

(56) References Cited

U.S. PATENT DOCUMENTS

| | | | | |
|---|---|---|---|---|
| 5,161,093 | A * | 11/1992 | Gorczyca | H01L 21/4857 257/E23.173 |
| 5,353,195 | A * | 10/1994 | Fillion | H01L 24/82 257/E23.079 |
| 5,497,033 | A * | 3/1996 | Fillion | H01L 24/82 257/E25.011 |
| 7,045,886 | B2 * | 5/2006 | Sawada | H01L 21/563 257/E23.067 |
| 10,985,101 | B2 * | 4/2021 | Lai | H01L 23/5226 |
| 2015/0287697 | A1 * | 10/2015 | Tsai | H01L 24/97 257/773 |
| 2016/0079196 | A1 * | 3/2016 | Teh | H01L 23/50 257/773 |
| 2020/0273839 | A1 * | 8/2020 | Elsherbini | H01L 25/50 |
| 2021/0057303 | A1 * | 2/2021 | Chen | H01L 21/486 |
| 2021/0057346 | A1 * | 2/2021 | Tsai | H01L 23/5381 |
| 2021/0118847 | A1 * | 4/2021 | Chuang | H01L 24/24 |

* cited by examiner

SEMICONDUCTOR PACKAGE AND METHOD OF FABRICATING SEMICONDUCTOR PACKAGE

BACKGROUND

Packaging technologies involve encapsulating materials for wrapping and packing semiconductor dies with integrated circuits (ICs) and electronic devices, and reliable electrical inter-connection between the semiconductor dies and other devices within the packages are important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
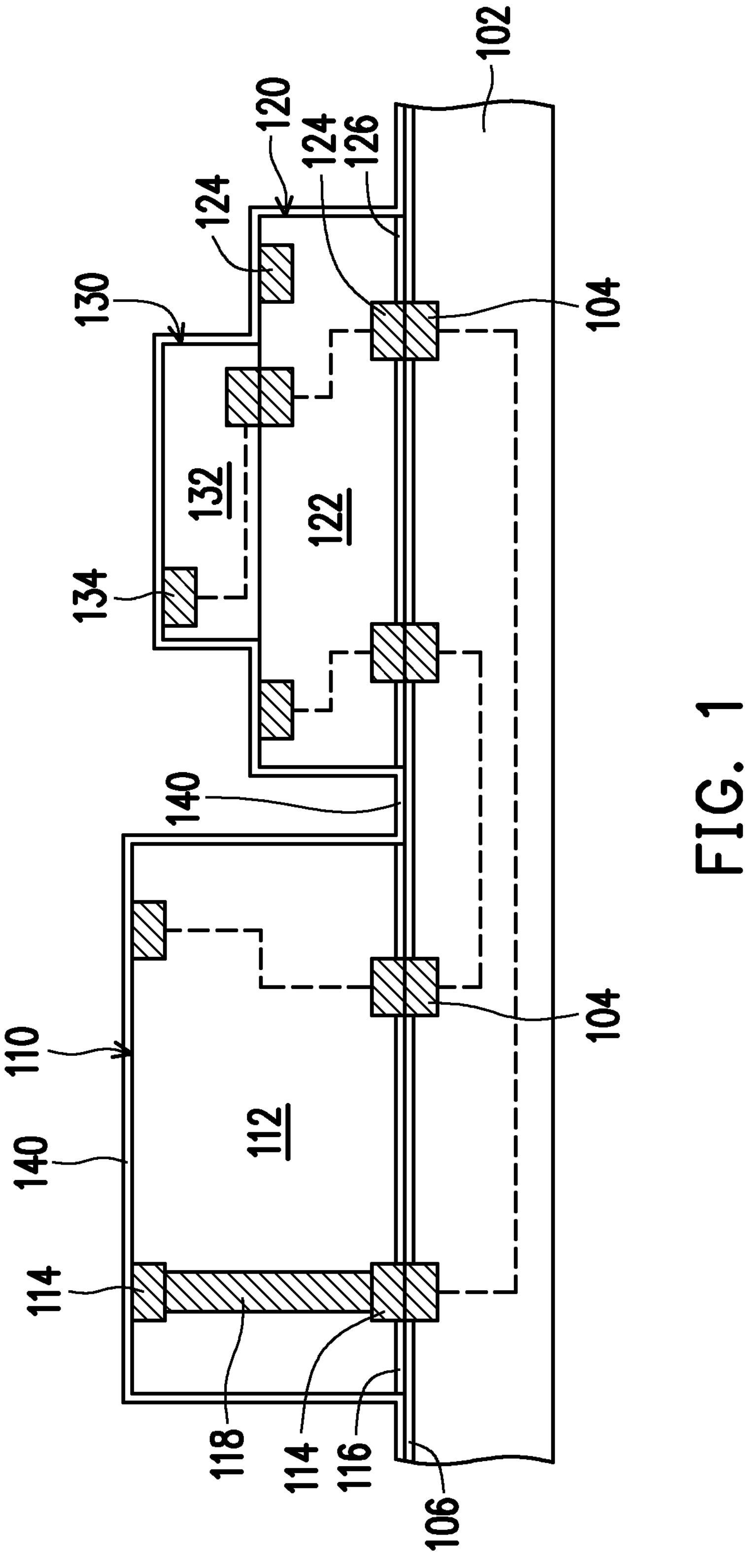
FIG. 1 through FIG. 7 schematically illustrate various stages of processes for forming an interlink structure according to a method of fabricating a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 7 are schematic cross-sectional views illustrating various stages of processes for forming an interlink structure according to a method of fabricating a semiconductor package in accordance with some embodiments of the present disclosure. FIG. 8 is a schematic three-dimensional (3D) view illustrating a semiconductor package having the interlink structure in accordance with some embodiments of the present disclosure. The exemplary structures as shown in FIG. 1 to FIG. 7 may be schematic cross-sectional view cut along the cross-section line I-I' shown in FIG. 8.

Referring to FIG. 1, a substrate 102 having a plurality of contact pads 104 embedded in a bonding film 106 is provided. In some embodiments, the substrate 102 is a semiconductor bulk wafer having plural semiconductor chips therein. In some embodiments, the substrate 102 may be a monocrystalline semiconductor substrate such as a silicon substrate, a silicon-on-insulator (SOI) substrate, silicon-germanium on insulator (SGOI) or a germanium-on-insulator (GOI) substrate, for example. In some embodiments, the substrate 102 includes a semiconductor substrate made of semiconductor materials, such as semiconductor materials of the groups III-V of the periodic table. In some embodiments, the semiconductor substrate includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In certain embodiments, the substrate 102 is a reconstituted wafer including a plurality of dies molded in a molding compound. In accordance with the embodiments, the semiconductor substrate may include other conductive layers, doped regions or other semiconductor components, such as active components (e.g., transistors or the like) and/or passive components (e.g., resistors, capacitors, inductors, or the like) formed therein. In certain embodiments, the contact pads 104 include metallic pads of aluminum, copper, alloys thereof or other suitable metallic material. The embodiments are intended for illustration purposes but not intended to limit the scope of the present disclosure.

Referring to FIG. 1, in some embodiments, a first semiconductor die 110 and a second semiconductor die 120 are disposed on the substrate 102 and bonded to the substrate 102, and the first semiconductor die 110 and the second semiconductor die 120 disposed on the substrate 102 are arranged side by side but are spaced apart from each other. In some embodiments, a third semiconductor die 130 is disposed on and bonded to the second semiconductor die 120. In some embodiments, the first semiconductor die 110 includes a semiconductor substrate 112, contact pads 114, a bonding film 116 and a through via 118 connecting the upper and bottom contact pads 114. For example, the contact pads 114 may be formed on the upper and bottom surfaces of the first semiconductor die 110, and the bottom contact pads 114 are exposed from the bonding film 116. In some embodiments, the through via 118 connecting the upper and bottom contact pads 114 may be used to connect the first semiconductor die 110 to other devices or components. In certain embodiments, the contact pads 114 include aluminum pads, copper pads, or other suitable metal pads. In some embodiments, the material of the bonding film 106 or 116 includes silicon oxide, silicon nitride, undoped silicate glass material or a suitable dielectric material. In some embodiment, the bonding film may be formed through performing a chemical vapor deposition (CVD) process such as low-pressure CVD (LPCVD), plasma enhanced CVD (PECVD), and high-density plasma CVD (HDPCVD). In some embodiments, the through via 118 is a through semiconductor via, and a material of the through via 118 includes copper, tungsten, titanium, alloys thereof, or other conductive materials, and may be formed by deposition, plating, or other suitable techniques.

In some embodiments, referring to FIG. 1, similar structural features as the ones just discussed for the first semiconductor die 110 may be found in the second and third semiconductor dies. In some embodiments, the second semiconductor die 120 includes a semiconductor substrate 122, contact pads 124 and a bonding film 126 For example, the contact pads 114 may be formed on the upper and bottom surfaces of the second semiconductor die 120, and the bottom contact pads 124 are exposed from the bonding film 126. As illustrated in FIG. 1, in some embodiments, the first and second semiconductor dies 110 and 120 are bonded to the substrate 102 though hybrid bonding techniques. In some embodiments, the bonding films 106 and 116 of the semiconductor dies 110 and 120 are bonded to each other via dielectric bonding, while the contact pads 104 and 114 exposed from the bonding films are bonded to each other via metal-to-metal bonding. For example, a bonding process is performed to bond the semiconductor dies to the substrate. In some embodiments, the bonding process is a hybrid bonding process. In one embodiments, during the application of hybrid bonding techniques, a low temperature heating process at a temperature of about 100° C. to about 200° C. is performed to heat and bond the dielectric bonding films, and a high temperature heating process is performed at a temperature of about 200° C. to about 300° C. to heat the metallic pads such that the metallic pads are bonded and the dielectric bonding films are cured and adhered to each other.

In some embodiments, referring to FIG. 1, the third semiconductor die 130 includes a semiconductor substrate 132 and contact pads 134 formed on upper and bottom surfaces of the die 130. In some embodiments, the third semiconductor die 130 is hybrid bonded to the second semiconductor die 120. For the purpose of simplicity, the structural features included in the semiconductor dies are fully illustrated but it is understood that structural features such as dielectric layer(s), metallic interconnections, conductive through vias or bonding films may be included for electrical connections and device functions. As seen in FIG. 1, the dotted lines shown in the semiconductor dies schematically represent inner electrical interconnection between the contact pads and within the dies.

In some embodiments, the first and second semiconductor dies 110 and 120 are bonded to the substrate 102 though flip chip technologies using conductive connectors such as metal pillars, controlled collapse chip connection (C4) bumps, micro bumps or combinations thereof. In some embodiments, the third semiconductor die 130 is bonded to the second semiconductor die 120 though flip chip technologies.

In some embodiments, the semiconductor dies 110, 120, 130 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 110, 120, 130 include a memory die such as a high bandwidth memory die, a dynamic random access memory (DRAM) die or a static random access memory (SRAM) die. In some embodiments, the semiconductor dies 110, 120, 130 may be the same type of dies or perform the same functions. In some embodiments, the semiconductor dies 110, 120, 130 may be different types of dies or perform different functions. In some embodiments, the second semiconductor die 120 includes a logic die, the first semiconductor die 110 includes a memory die such as a DRAM die, and the third semiconductor die 130 includes a memory die such as a SRAM die. In some embodiments, the semiconductor dies 110, 120, 130 are of different sizes. For example, a span of the first semiconductor die 110 is larger than a span of the second semiconductor die 120, and the span of the second semiconductor die 120 is larger than a span of the third semiconductor die 130. In some embodiments, the semiconductor dies 110, 120, 130 are of different thickness (or heights). In one embodiment, the first semiconductor die 110 is a DRAM die having a thickness of about 30 microns to about 50 microns, the second semiconductor die 120 is a logic die having a thickness of about 8 microns to about 12 microns, and the third semiconductor die 130 is a SRAM die having a thickness of about 3 microns to about 5 microns.

In some embodiments, as seen in FIG. 1, a dielectric layer 140 is formed over the substrate 102 covering the first, second and third semiconductor dies 110, 120 and 130. In some embodiments, the dielectric layer 140 is formed over the substrate 102 conformally covering the first, second and third semiconductor dies 110, 120 and 130. That is, the sidewalls and top surfaces of the first, second and third semiconductor dies 110, 120 and 130 are covered by the dielectric layer 140, and the dielectric layer 140 also covers the exposed top surface of the substrate 102. In some embodiments, the dielectric layer 140 is formed by a deposition process including CVD or atomic layer deposition (ALD). In some embodiments, the dielectric layer 140 is an etching resistant layer (i.e. a resistant layer) and may function as an etch stop layer to prevent the underlying layers being damaged during the subsequent etching processes. In some embodiments, the dielectric layer 140 includes an inorganic dielectric material layer. In some embodiments, a material of the dielectric layer 140 includes silicon nitride, silicon carbide, silicon oxynitride or a combination thereof. In some embodiments, a material of the dielectric layer 140 includes silicon nitride. In some embodiments, the dielectric layer 140 has a thickness of about 500 angstroms to about 5000 angstroms.

In FIG. 1 only three semiconductor dies 110, 120, 130 are shown on the substrate 102 for simplicity, but the disclosure is not limited thereto. In some embodiments, the semiconductor package being formed may include more or fewer semiconductor dies than what illustrated in FIG. 1, as well as other components (e.g., dummy dies, passive components, redistribution or routing structures, support blocks, heat dissipation elements etc.). Furthermore, whilst the process is currently being illustrated for a chip-on-wafer (CoW) process and may be further fabricated into 3D stacking packages or chip-on-wafer-on-substrate (CoWoS) packages, the disclosure is not limited to the package structure shown in the drawings. It is understood that other types of packages such as integrated fan-out (InFO) packages or package-on-packages (PoP), etc., are also meant to be covered by the present disclosure and to fall within the scope of the appended claims.

Figure 2:
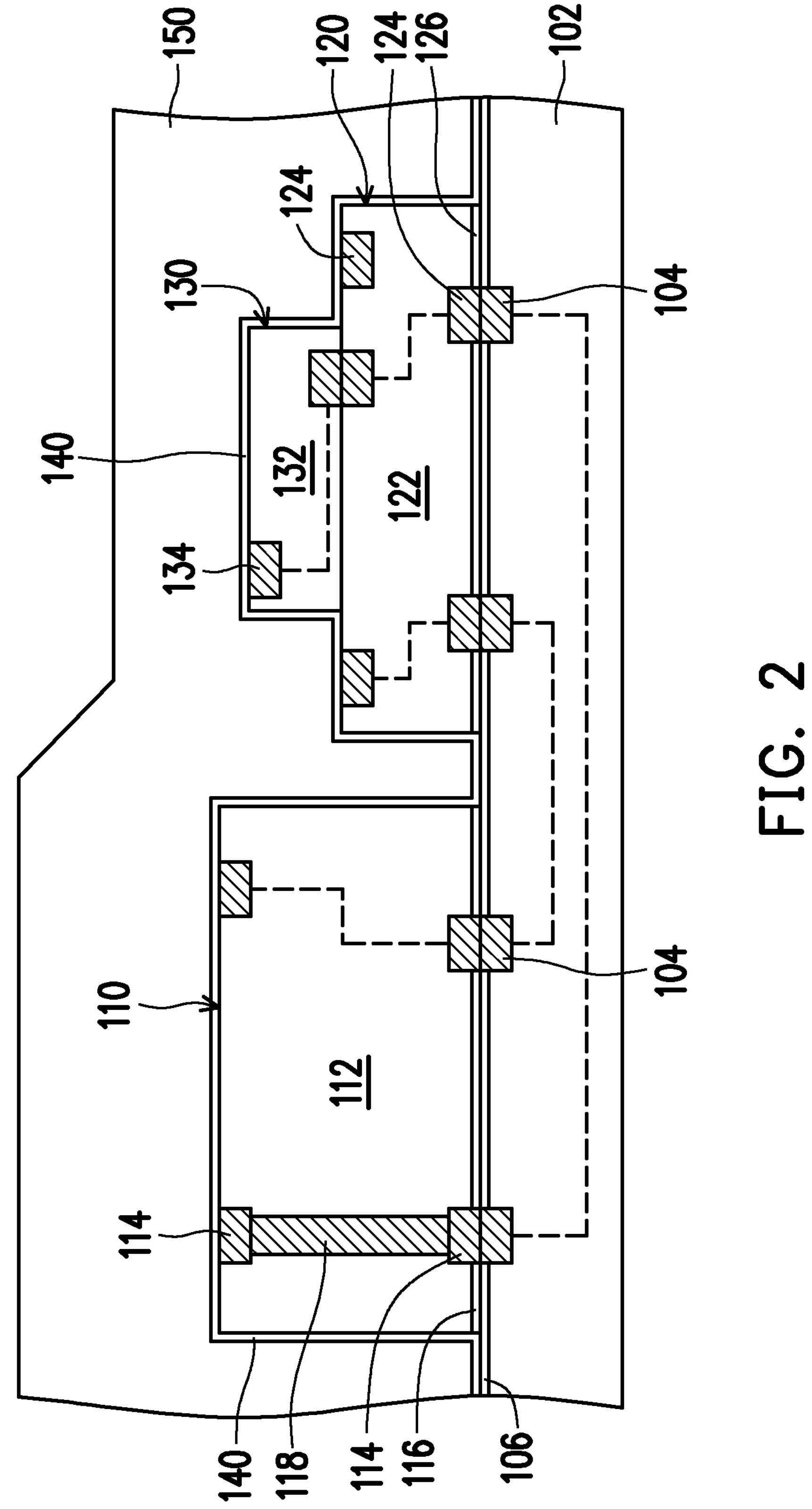

Referring to FIG. 2, in some embodiments, an encapsulant 150 is formed over the substrate 102 covering the dielectric layer 140 on the substrate 102 and on the semiconductor dies 110, 120, 130. In some embodiments, the formation of the encapsulant 150 involves forming an encapsulation material (not shown) to completely covering the semiconductor dies 110, 120, 130 with filling up the gap/space between the first semiconductor die 110 and the second and third semiconductor dies 120 and 130. Due to the thickness/height differences between the semiconductor dies arranged on the substrate 102, the encapsulant 150 has a profile somehow conforming with the underlying die stacks. That is, the encapsulant 150 has an uneven or bumpy profile. In some embodiments, the encapsulation material of the encapsulant 150 may be a molding compound, a molding underfill, a resin (such as an epoxy resin), an oxide filling material (such as silicon oxide or silicate glass materials) or the like. In some embodiments, the encapsulation material of the encapsulant 150 includes an oxide filling material (such as silicon oxide or silicate glass materials) or the like. In one embodiment, the encapsulant 150 includes an oxide material such as silicon oxide. In some embodiments, the material of the dielectric layer 140 is different from the material of the encapsulant 150. In some embodiments, the encapsulation material is formed by an over-molding process. In some embodiments, the encapsulation material is formed by a compression molding process. In some embodiments, the encapsulation material may require a curing step.

Figure 3:
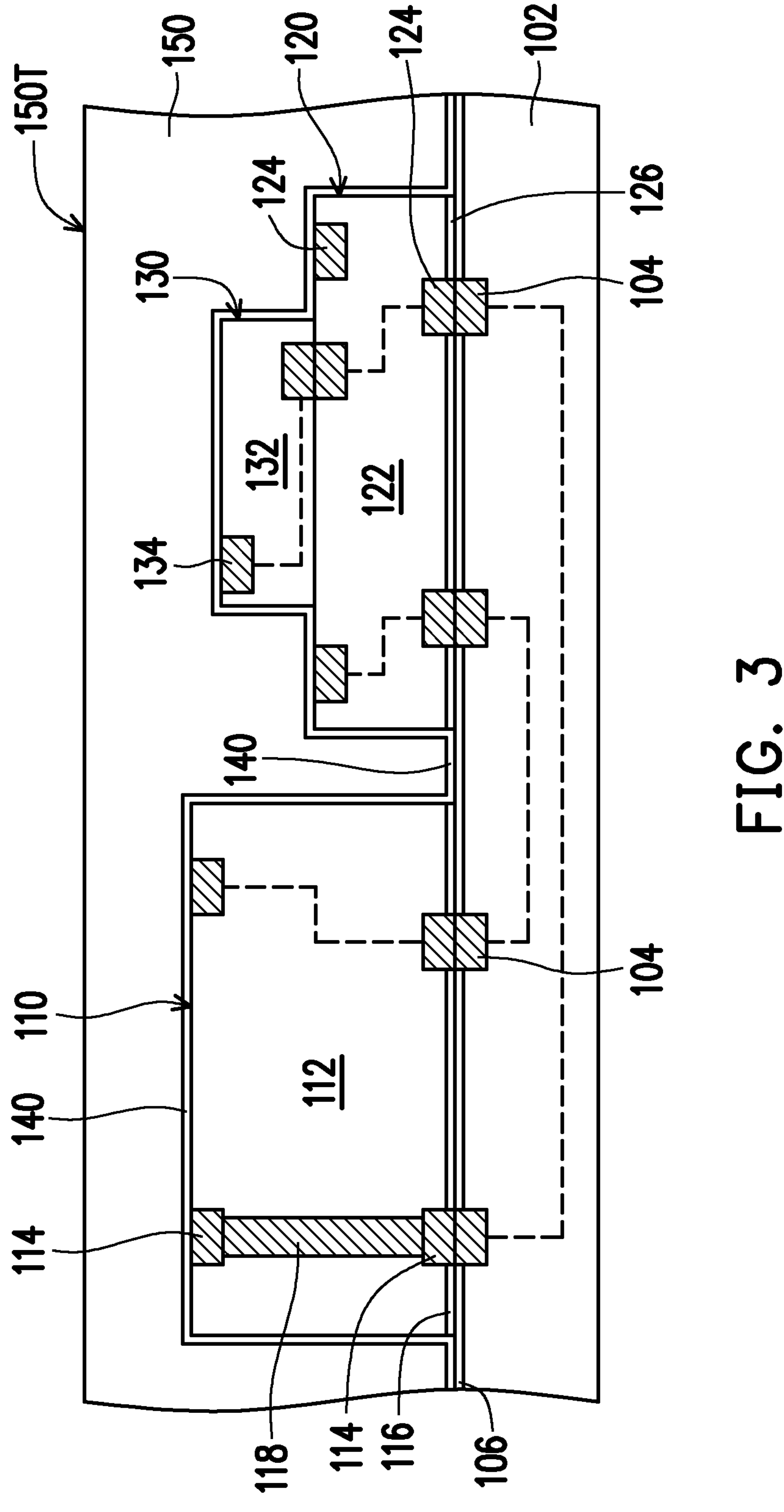

Later, referring to FIG. 3, a planarization process, including one or more of a mechanical grinding process, a chemical mechanical polishing (CMP) process or a combination thereof is performed to the encapsulant 150 until a horizontally flat top surface 150T is obtained for the planarized encapsulant 150. In some embodiments, even after the planarization process, the top surfaces of the semiconductor dies 110, 120, 130 are unexposed from and covered by the dielectric layer 140 and the encapsulant 150. In some embodiments, the top surface 150T of the encapsulant 150 is substantially horizontally parallel to the main surface of the substrate 102.

Figure 4:
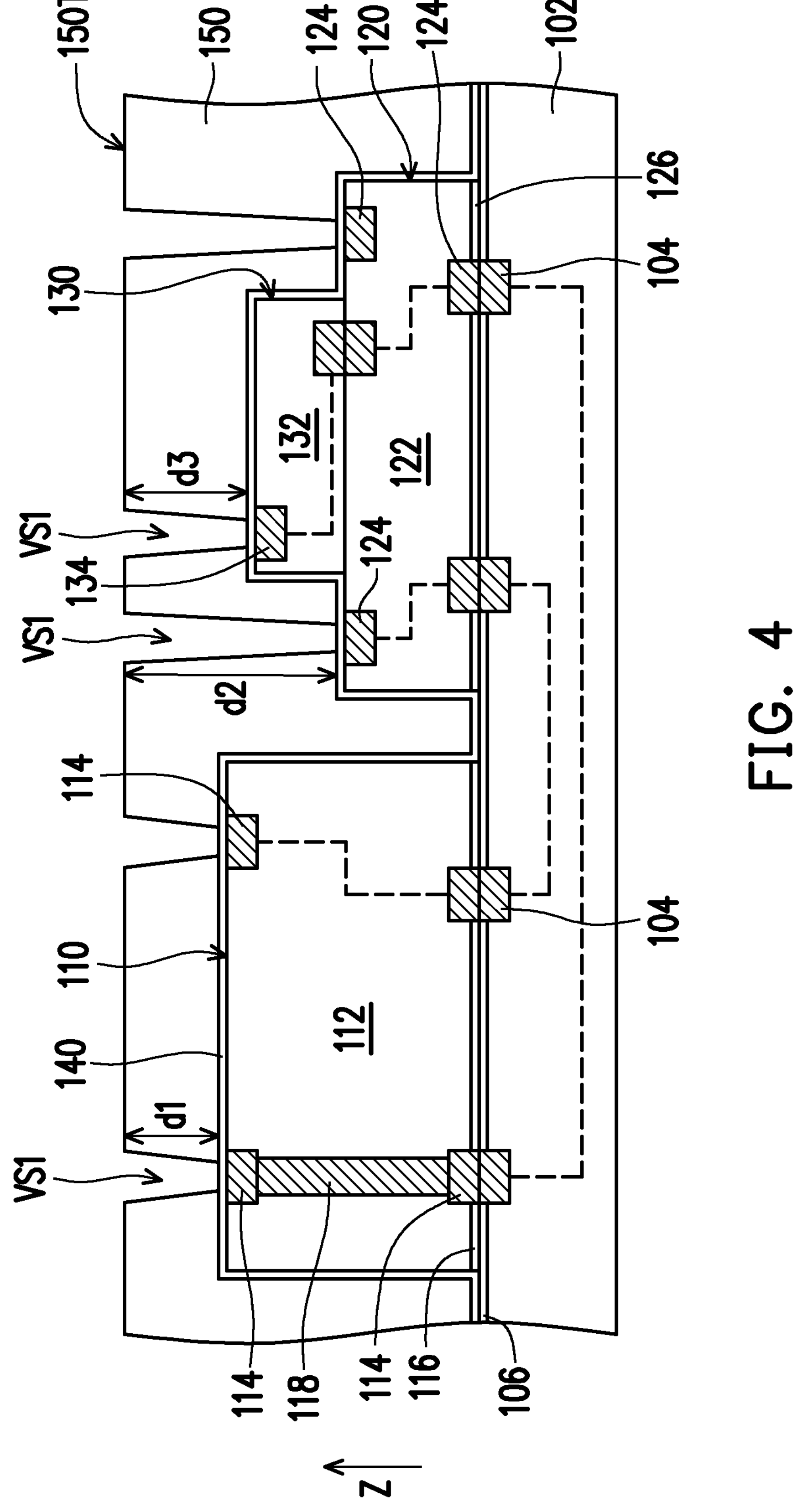

In some embodiments, referring to FIG. 4, a first patterning process is performed, the encapsulant 150 is patterned and openings VS1 are formed in the patterned encapsulant 150. In some embodiments, the openings VS1 of the patterned encapsulant 150 include via openings. In some embodiments, the locations of the via openings correspond to the locations of some contact pads 114, 124, 134 formed on the respective top surfaces of the semiconductor dies 110, 120, 130, but the via openings expose the dielectric layer 140 above the contact pads 114, 124, 134. In some embodiments, the locations of the via openings correspond to the locations of the contact pads 114/124/134 in a one to one fashion. In some embodiments, the dielectric layer 140 functions as an etch stop layer during the first patterning process. In certain embodiments, the encapsulant 150 is patterned by performing photolithographic and etching processes using one or more mask patterns. In certain embodiments, the encapsulant 150 is partially removed through exposure and developing processes and one or more etching processes (such as anisotropic etching). During the patterning process, the etching process selectively removes the encapsulant 150 and high etching selectivity exists between the material of the dielectric layer 140 and the material of the encapsulant 150. In certain embodiments, the patterning of the encapsulant 150 includes performing a laser ablation process.

As seen in FIG. 4, in some embodiments, the via openings VS1 are formed with different depths d1, d2, d3 in the vertical thickness direction Z (perpendicular to top surface 150T). In some embodiments, the openings VS1 at locations corresponding to the contact pads 114 have the depth d1, the openings VS1 at locations corresponding to the contact pads 124 have the depth d2, and the openings VS1 at locations corresponding to the contact pads 134 have the depth d3. For example, the depth d1 is smaller than the depth d3, and the depth d3 is smaller than the depth d2. In some embodiments, the openings VS1 may be formed at locations corresponding to the contact pads 104 of the substrate with a depth d5 (see FIG. 8) that is larger than the depth d4. It is possible to form the via openings VS1 of different depths during one single patterning process, by using the dielectric layer 140 as the etch stop layer, the encapsulant 150 is vertically etched until the dielectric layer 140 is exposed. In some embodiments, the via openings VS1 are shown to have slant sidewalls, but it is understood that substantially straight upright sidewalls may be formed depending on the aspect ratios of the openings.

Through the application of the etch stop layer conformally covering the stacked dies of different thicknesses, sizes and/or profiles, via openings of different depths may be flexibly formed at pre-determined locations without repeatedly forming multiple dielectric material layers and performing planarization processes to form vias in different depths.

Figure 5:
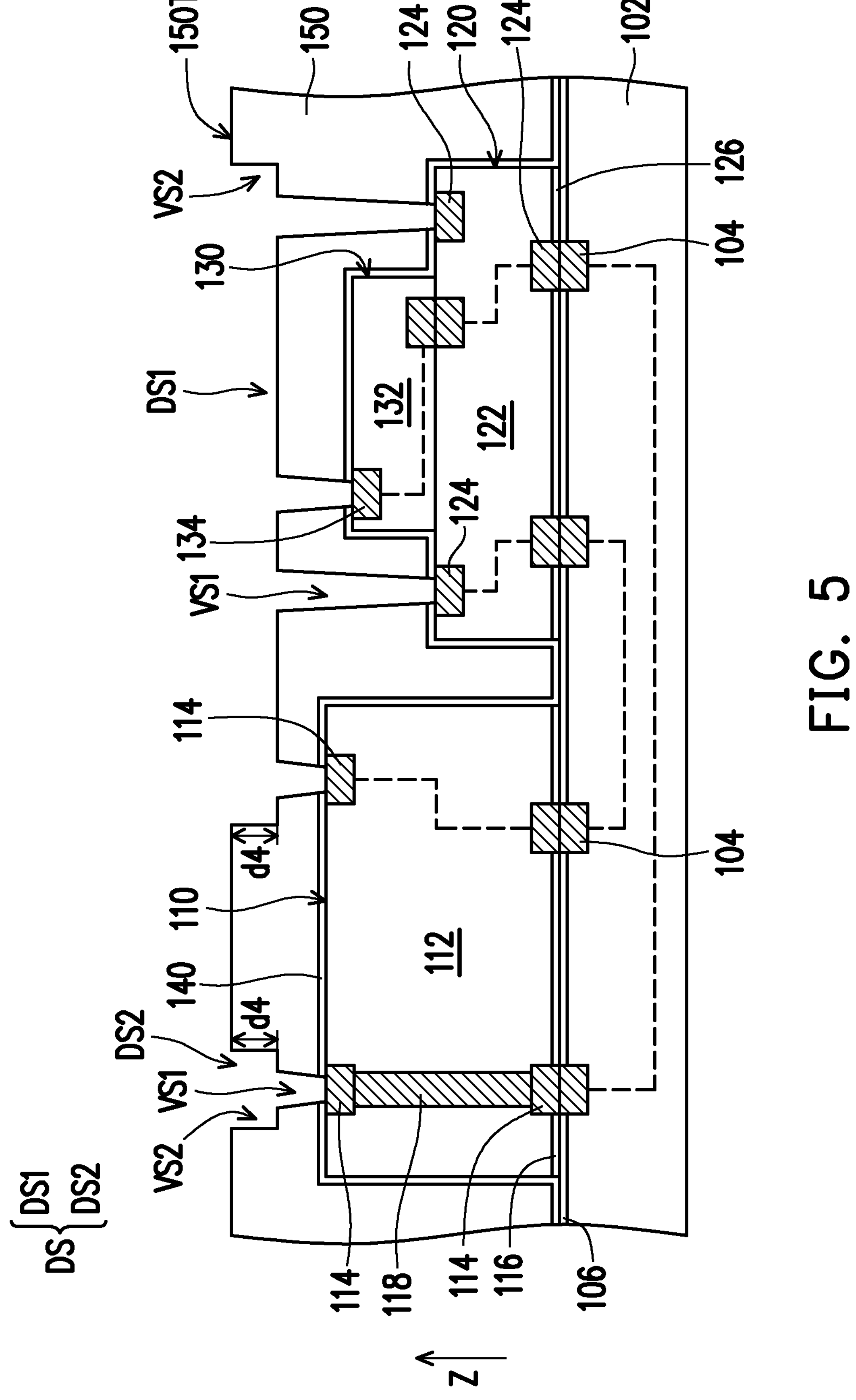

In some embodiments, referring to FIG. 5, a second patterning process is performed, the encapsulant 150 is again patterned and openings VS2 are formed in the patterned encapsulant 150. In some embodiments, the openings VS2 of the patterned encapsulant 150 include trench openings, and the trench openings VS2 are connected and joined with the via openings VS1 to become damascene or dual damascene openings DS. In some embodiments, the locations of the trench openings correspond to and partially overlap with the locations of the via openings. In some embodiments, the locations of the trench openings correspond to the locations of some contact pads 114/124/134 in a one to multiple fashion. In some embodiments, the trench opening(s) VS2 extend between the locations of the corresponding contact pads 114, 124, 134 on the respective top surfaces of the semiconductor dies 110, 120, 130. In some embodiments, during the patterning process, the dielectric layer 140 exposed by the via openings VS1 is removed and the contact pads 114, 124, 134 are exposed by the joined dual damascene openings DS. In certain embodiments, the second patterning process of the encapsulant 150 is similar to the first patterning process using one or more mask patterns. Details will not be repeated herein.

Referring to FIG. 5, in some embodiments, as seen in the cross-sectional view of FIG. 1C, portions of the trench openings VS2 that are not located directly above the via openings VS1 expose the underlying encapsulant 150. In some embodiments, the trench openings VS2 located above the via openings VS1 may be in strip shapes (as routing lines) or intersecting strips. In some embodiments, one trench opening VS2 is open to (i.e. joined with) several via openings VS1, and the joined trench and via openings constitute a dual damascene opening DS1 exposing contact pads 114, 124, 134. In some embodiments, one trench opening VS2 is joined with several via openings VS1 to constitute a dual damascene opening DS2 exposing the contact pad 114 connected with the through via 118. In some embodiments, in FIG. 5, the trench openings VS2 are formed with a depth d4, and the depth d4 is smaller than the depth d1. In some embodiments, some of the trench openings VS2 have substantially vertical sidewalls. However, the trench openings VS2 and the dual damascene openings DS1, DS2 may have slanted sidewalls. In certain embodiments, the via openings VS1 are formed with a substantially round or oval shape, while the trench openings VS2 are formed in one or more shapes and in one or more sizes.

In alternative embodiments, it is likely to form the encapsulant as multiple stacked dielectric material layers respectively having the via openings and the trench openings formed therein.

Figure 6:
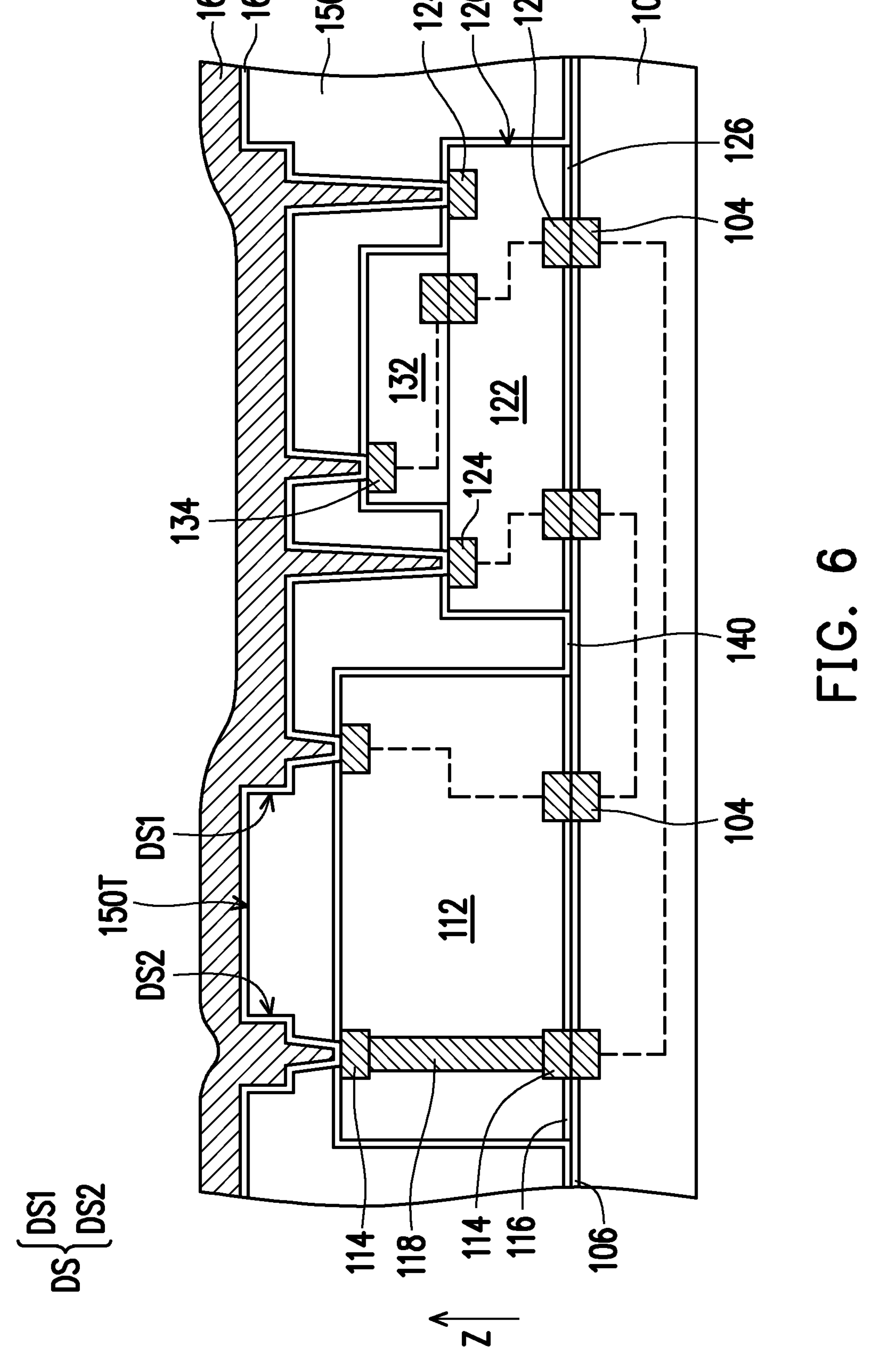

Referring to FIG. 6, in some embodiments, a liner layer 162 is formed over the patterned encapsulant 150 and covering the dual damascene openings DS (including openings DS1 and DS2). In certain embodiments, the liner layer 162 is formed conformal to the profiles of the patterned encapsulant 150 and covering the dual damascene openings DS. That is, the liner layer 162 conformally covers the dual damascene openings DS1 and DS2, evenly covering the sidewalls and bottom surfaces of the dual damascene openings DS1 and DS2 and covering the top surface 150T of the encapsulant 150. In certain embodiments, the liner layer 162 includes one or more metallic layer. In some embodiments, the liner layer 162 includes a composite of a seed layer (not shown) and a barrier layer (not shown) formed by CVD (such as PECVD or HDPCVD), physical vapor deposition (PVD), ALD or combinations thereof. In certain embodiments, the liner layer 162 is formed by sequentially depositing or sputtering a layer of titanium, tantalum, titanium nitride (TiN) or tantalum nitride (TaN) as a barrier layer and a copper layer as a seed layer. In one embodiment, the liner layer 162 covers and is in contact with the exposed surfaces of the contact pads 114/124/134 (i.e. bottom surfaces of the via openings VS1). In certain embodiments, for the trench openings VS2 that are not located directly above the via openings VS1, the liner layer 162 is formed conformally covering the sidewalls and bottom surfaces of the trench openings VS2.

Referring to FIG. 6, a metal layer 160 is formed on the liner layer 162 and fills up the dual damascene openings DS1, DS2 in the encapsulant 150. In some embodiments, a material of the metal layer 160 includes aluminum (Al), copper (Cu), tungsten (W), cobalt (Co), alloys thereof, or combinations thereof. In some embodiments, the formation of the metal layer 160 includes forming a copper layer or a copper alloy layer (not shown) on the liner layer 162 by electroplating to fill up the dual damascene openings DS1, DS2. In some embodiments, the metal layer 160 is formed by a CVD process, an electrochemical plating (ECP) process or even a sputtering process. However, it is appreciated that the scope of this disclosure is not limited to the materials and descriptions disclosed above.

In some embodiments, as a conformal liner layer is formed before filling the metal layer into the openings, better adhesion and less diffusion are ensured for the later formed metal layer.

Figure 7:
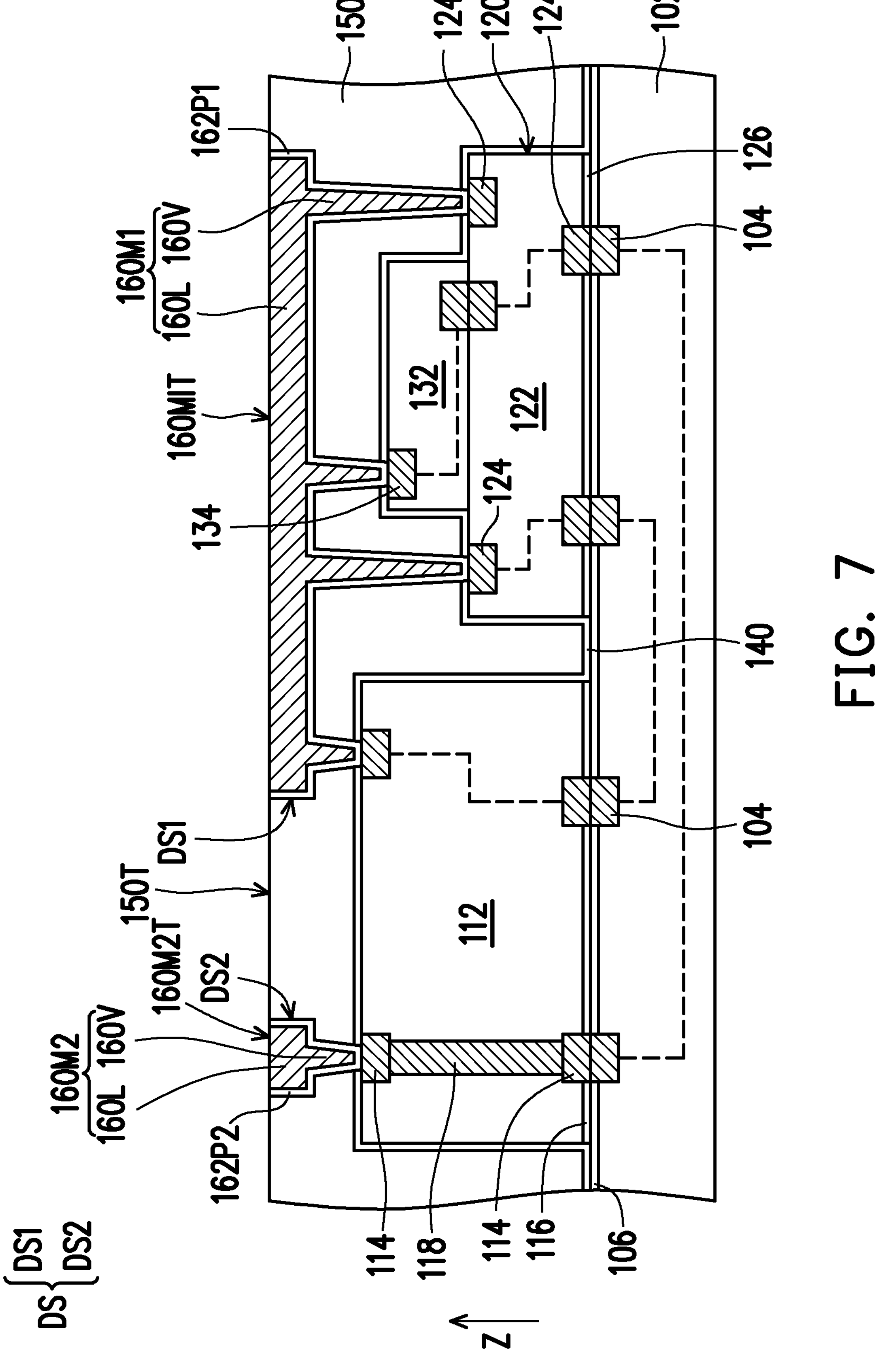
Figure 8:
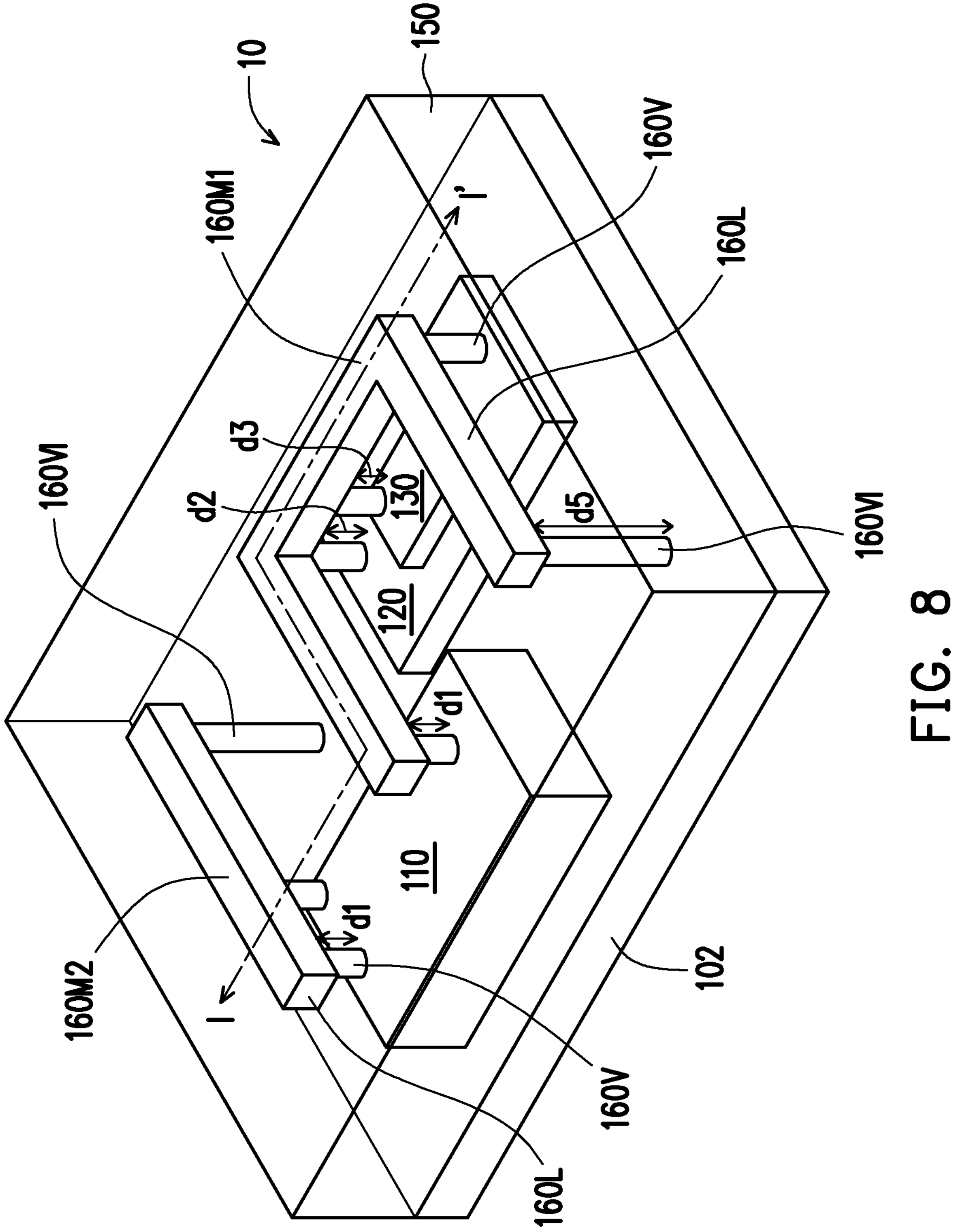
FIG. 8 schematically illustrates a semiconductor package having the interlink structure in accordance with some embodiments of the present disclosure.

Referring to FIG. 7, in some embodiments, a planarization process is then performed to remove the extra metal materials above the encapsulant 150. That is, the planarization process is performed to partially remove the extra materials of the metal layer 160 and the liner layer 162 (i.e. the metal layer 160 and the liner layer 162 located above the top surface 150T of the encapsulant 150). In some embodiments, after the planarization process, the metal layer 160 along with the liner layer 162 above the top surface 150T of the encapsulant 150 are removed until the top surface 150T of the encapsulant 150 is exposed, so as to form liner patterns 162P1 and 162P2 and interlink structures 160M1 and 160M2 respectively remained within the dual damascene openings DS1 and DS2. In some embodiments, the planarization process may include a chemical-mechanical polishing (CMP) process, a mechanical grinding process, a fly cutting process or an etching back process. In some embodiments, the planarization process may include a CMP process. In certain embodiments, after planarization, the interlink structures 160M1 and 160M2 are formed within the package structure 10. In some embodiments, after the planarization, the top surfaces 160M1T and 160M2T of the interlink structures 160M1 and 160M2 are coplanar and levelled with the top surface 150T of the planarized encapsulant 150, and the top surfaces 160M1T and 160M2T of the interlink structures 160M1 and 160M2 (as well as the top surface 150T of the planarized encapsulant 150) are rather smooth and have a roughness Ra (Ra is the arithmetic average of the surface roughness profile) smaller than 10 angstroms or ranging from 2 angstroms to 5 angstroms.

In some embodiments, after the planarization, the liner patterns 162P1 and 162P2 and interlink structures 160M1 and 160M2 are respectively formed in the dual damascene openings DS1 and DS2. As seen in FIG. 7, in some embodiments, the interlink structures 160M1 and 160M2 include horizontally extending routing line portions 160L filled within the trench openings VS2 and vertically extending via portions 160V filled within the via openings VS1. In some embodiments, after the formation of the interlink structures 160M1 and 160M2, a singulation process or a dicing process may be optionally performed to cut the whole structure into individual package structures 10.

In some embodiments, after planarization, as seen in FIG. 7 and FIG. 8, the liner layer 162 and the metal layer 160 remained within the damascene openings DS1 and DS2 become the liner patterns 162P1 and 162P2 and interlink structures 160M1 and 160M2. In some embodiments, the liner pattern 162P1 is located within the damascene opening DS1, sandwiched between the interlink structure 160M1 and the damascene openings DS1, and conformally covers the sidewalls and bottom surface of the interlink structure 160M1 (also covering the sidewalls and bottom surface of the damascene openings DS1). In some embodiments, the liner pattern 162P2 is located within the damascene opening DS2, sandwiched between the interlink structure 160M2 and the damascene openings DS2, and conformally covers the sidewalls and bottom surface of the interlink structure 160M2 (also covering the sidewalls and bottom surface of the damascene openings DS2). In some embodiments, the liner pattern 162P1 or 162P2 located with the damascene opening DS1 or DS2 is an integral piece uniformly and conformally covering the sidewalls and bottom surface of the dual damascene opening DS1 or DS2 and the liner patterns 162P1 and 162P2 are made from the same liner layer 162 (i.e. made of the same material). Similarly, the interlink structure 160M1 or 160M2 located with the damascene opening DS1 or DS2 is an integral piece, and are made from the same metal layer 160 (i.e. of the same metal/metallic material).

In some embodiments, as shown in FIG. 8, the interlink structure 160M1 includes a horizontally extending routing line portion 160L with a U-shaped top view and several vertically extending via portions 160V connected to the routing line portion 160L at different locations. As illustrated in in FIGS. 4, 5 and 8, the via portions 160V/160VI that are formed within the via openings VS1 with depths of d1, d2, d3 and d5 have the corresponding lengths. As seen in FIG. 8, in some embodiments, in addition to the via portions of lengths d1, d2 and d3, the interlink structure 160M1 further includes a via portion 160VI (formed in the via opening at the location corresponding to the contact pad 104 of the substrate 102) with a length d5.

In some embodiments, as shown in FIG. 8, the interlink structure 160M2 includes a routing line portion 160L with a I-shaped top view and two via portions 160V of a length d1 and a via portion 160VI with a length d5.

In some embodiments, through the dual damascene process, the formed interlink structures provide good planarity for the subsequently formed upper layers. Compared with semi-additive processes, the manufacturing processes described in the above embodiments fabricate the package structures with the metallic dual damascene patterns with high design flexibility, lower costs and lower transmission loss, and such structures are applicable for packaging heterogeneous chips or dies with various height or sizes or high-density applications.

In certain embodiments, through the formation of the damascene openings, filling capability of the metal layer into the dual damascene openings is improved and better adhesion between the dual damascene openings and the interlink structures is provided through liner patterns formed there-between. In addition, since the metal layer filled into the joined trench and via openings is an integral piece, better mechanical strength and electrical properties are achieved.

Figure 9:
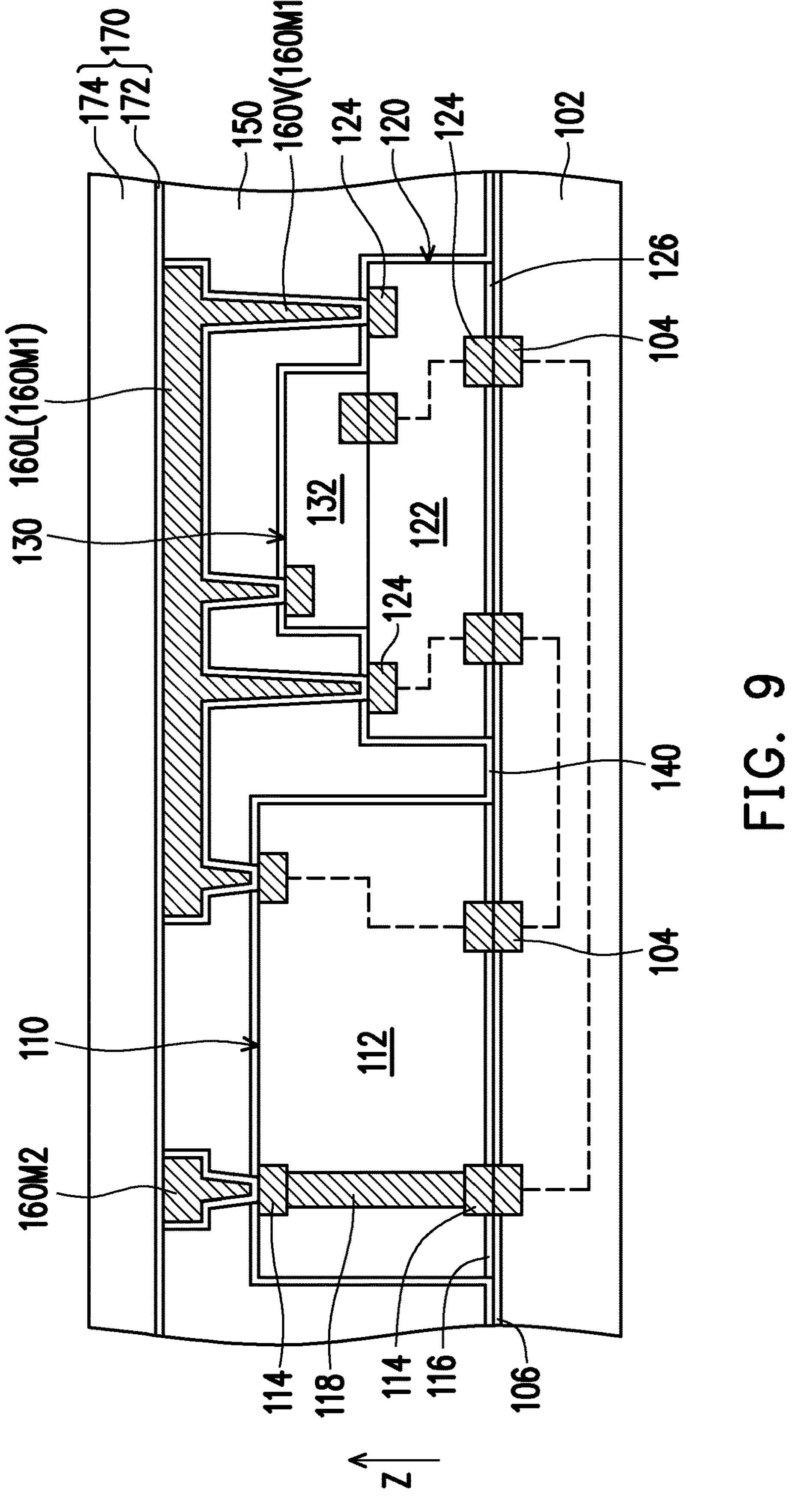
FIG. 9 through FIG. 10 schematically illustrate various stages of processes for forming another interlink structure according to a method of fabricating a semiconductor package in accordance with some embodiments of the present disclosure.
Figure 10:
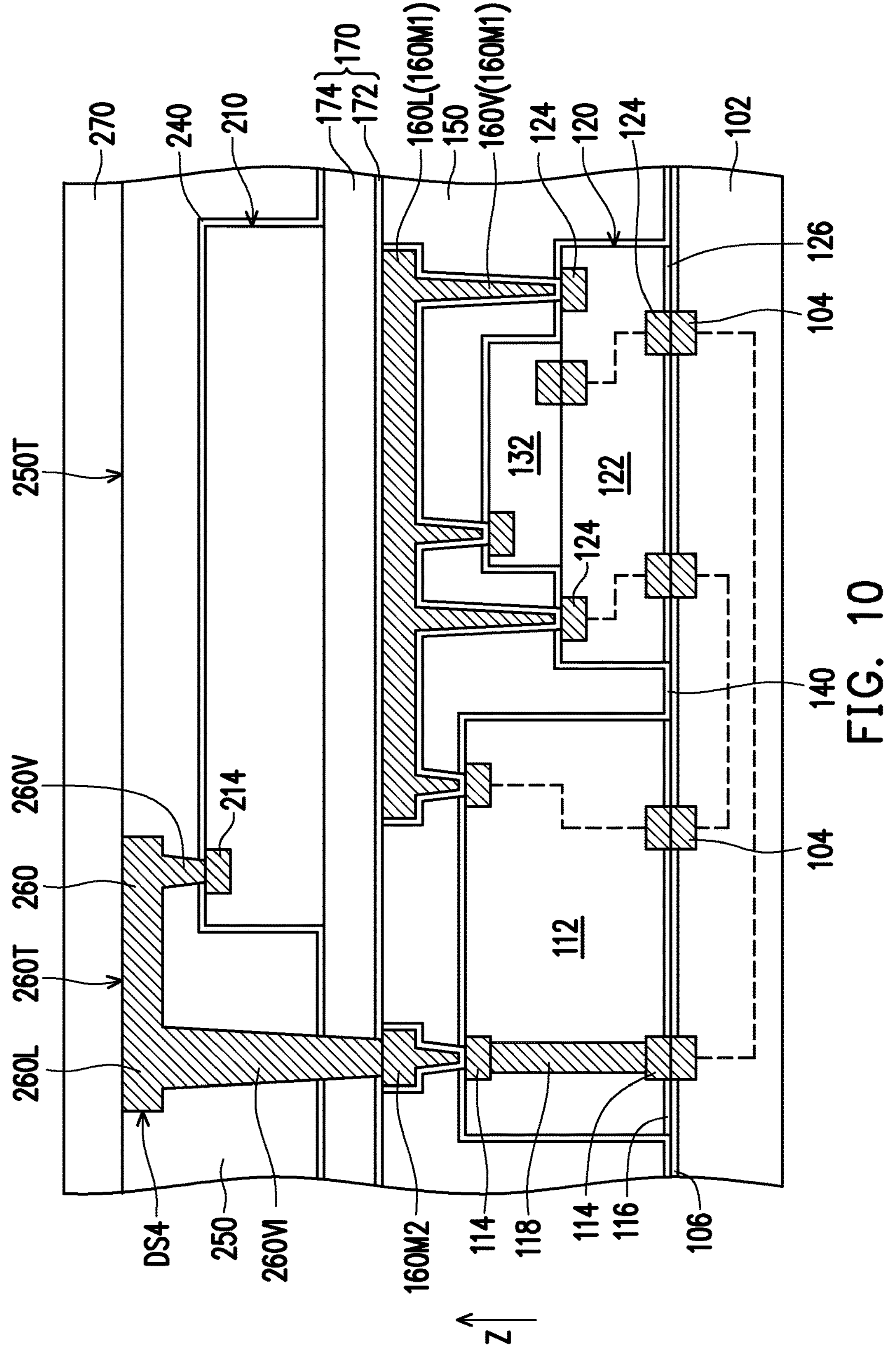
Figure 11:
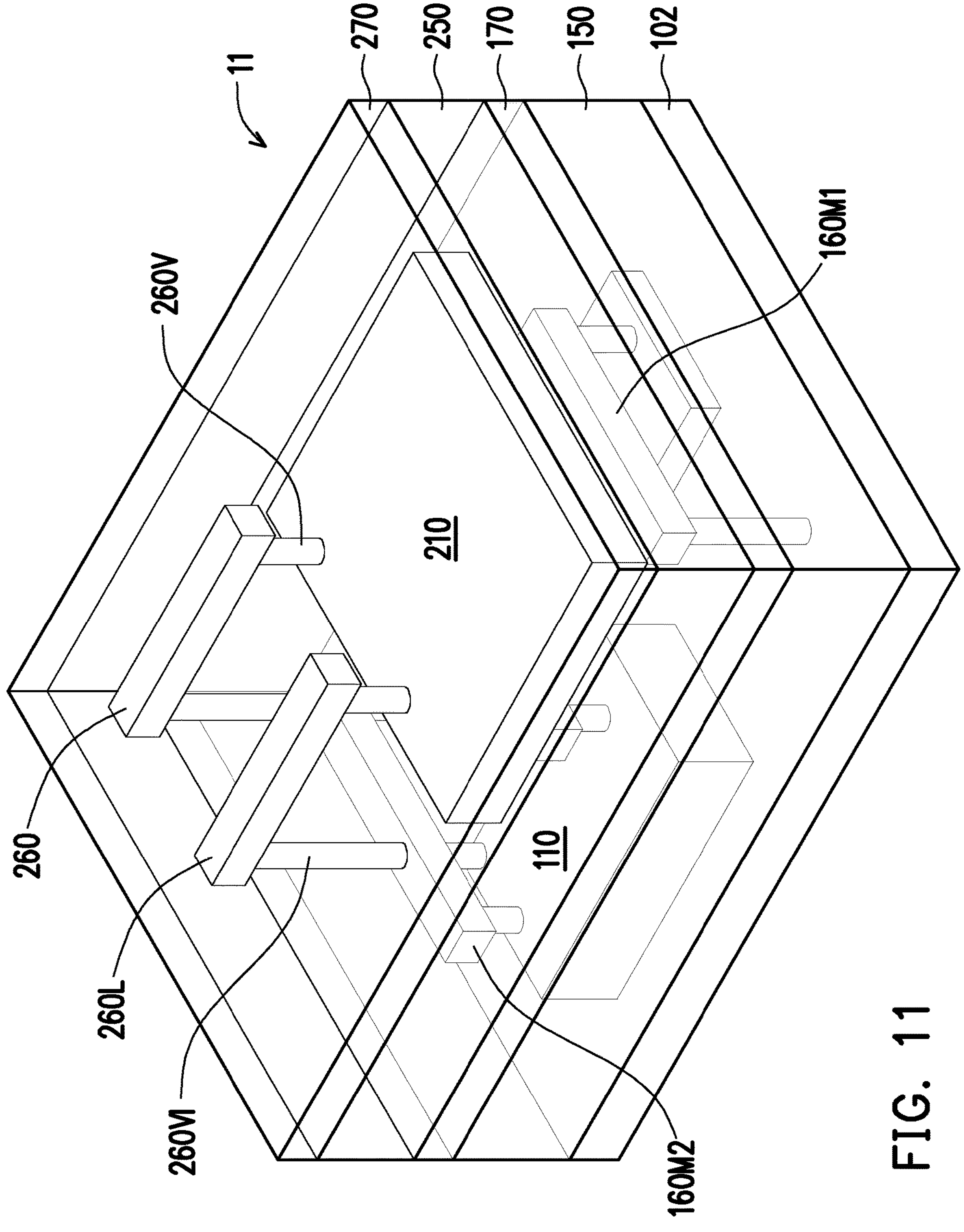
FIG. 11 schematically illustrates a semiconductor package having the interlink structure in accordance with some embodiments of the present disclosure

FIG. 9 through FIG. 10 are schematic cross-sectional views illustrating various stages of processes for forming another interlink structure according to a method of fabricating a semiconductor package in accordance with some embodiments of the present disclosure. FIG. 11 is a schematic 3D view of a semiconductor package structure having the interlink structures in accordance with some embodiments of the present disclosure.

Referring to FIG. 9, the exemplary stacked structure as illustrated in FIG. 7 is provided, and certain structural features may be omitted for simplicity. In some embodiments, a protection layer 170 is formed on the encapsulant 150 covering the interlink structures 160M1 and 160M2. In some embodiments, the protection layer 170 includes a lower protective layer 172 and an isolation layer 174 located on the lower protective layer 172. As seen in FIG. 9, the lower protective layer 172 fully covers and physically contacts top surfaces of the interlink structures 160M1 and 160M2 and the encapsulant 150. In some embodiments, a material of the protective layer 172 includes silicon nitride and a material of the isolation layer 174 includes silicon oxide. In some embodiments, the protection layer 170 may be formed by sequentially depositing the protective layer 172 and the isolation layer 174 through performing one or more CVD processes such as PECVD, LPCVD, and HDPCVD.

In some embodiments, referring to FIG. 10, a fourth semiconductor die 210 having a contact pad 214 is provided and disposed on the isolation layer 174 of the protection layer 170. In some embodiments, the fourth semiconductor die 210 may be attached to the protection layer 170 via a die attach film or an adhesive (not shown). In some embodiments, the fourth semiconductor die 210 may be or include a logic die, such as a CPU die, a GPU die, an MCU die, a I/O die, a baseband (BB) die, or an application processor (AP) die. In some embodiments, the fourth semiconductor die 210 may be or include a memory die such as a high bandwidth memory die, a DRAM die or a SRAM die.

Later, in some embodiments, referring to FIG. 10, another dielectric layer 240 is formed over the protection layer 170 conformally covering the fourth semiconductor die 210. That is, the sidewalls and the top surface of the fourth semiconductor die 210 are covered by the dielectric layer 240, and the dielectric layer 240 also covers the exposed top surface of the protection layer 170. In some embodiments, the dielectric layer 240 is formed by a deposition process including CVD or atomic layer deposition (ALD). In some embodiments, the dielectric layer 240 may function as an etch stop layer to prevent the underlying layers being damaged during the subsequent etching processes. In some embodiments, a material of the dielectric layer 240 is the same as a material of the dielectric layer 140. In some embodiments, a material of the dielectric layer 240 is different from a material of the dielectric layer 140. In some embodiments, a material of the dielectric layer 240 includes silicon nitride. In some embodiments, the dielectric layer 240 has a thickness of about 500 angstroms to about 5000 angstroms.

In some embodiments, referring to FIG. 10, an encapsulant 250 is formed on the protection layer 170 to cover the dielectric layer 240 and the semiconductor die 210. In some embodiments, the formation of the encapsulant 250 involves forming an encapsulation material (not shown) to completely covering the semiconductor die 210 and then performing a planarization process to the capsulation material so that the encapsulant 250 has an even and flat top surface 250T. In some embodiments, a material of the encapsulant 250 includes an oxide filling material such as silicon oxide or silicate glass materials. In one embodiment, the encapsulant 250 includes an oxide material such as silicon oxide. In some embodiments, the material of the encapsulant 250 is different from the material of the dielectric layer 240, and is different from the material of the encapsulant 150.

In some embodiments, referring to FIG. 10 and FIG. 11, following the similar methods and using similar materials, dual damascene openings DS4 are formed in the encapsulant 250 and interlink structures 260 are formed in the dual damascene openings DS4. Herein, the liner layer/pattern is omitted for illustration purposes but it is understood that the liner layer/patterns may be included if needed. As seen in FIG. 10, the top surface(s) 260T of the interlink structure(s) 260 and the top surface 250T of the encapsulant 250 are coplanar and levelled with each other, and the top surfaces 250T and 260T of the encapsulant 250 and the interlink structure(s) 260 are flat and smooth, and have a roughness Ra (Ra is the arithmetic average of the surface roughness profile) smaller than 10 angstroms or ranging from 2 angstroms to 5 angstroms.

In some embodiments, referring to FIG. 10 and FIG. 11, the interlink structures 260 include routing line portions 260L and via portions 260V/260VI connected with the routing line portions 260L. In some embodiments, after forming the interlink structures 260, another protection layer 270 is formed over the encapsulant 250 and covers the encapsulant 250 and the interlink structures 260. In some embodiments, the protection layer 270 may be a single layer or include multiple layers for protection and for isolation. In some embodiments, after the formation of the interlink structures 260, a singulation process or a dicing process may be optionally performed to cut the whole structure into individual package structures 11.

In some embodiments, as shown in FIG. 10 and FIG. 11, the interlink structure 260 includes the routing line portion 260L with an I-shaped top view and several via portions 260V/260VI connected to the routing line portion 260L at different locations. In some embodiments, the via portions 260V that are formed at locations corresponding to contact pads 214 have a length shorter than the via portions 260VI connected to the underlying interlink structures 160M2. In some embodiments, the via portions 260VI are formed within the via openings penetrating through the encapsulant 250 and the protection layer 170, and the via portions 260VI are directly connected to the routing line portion 160L of the interlink structure 160M2. In some embodiments, the via portions 260V of the interlink structures 260 are connected to the contact pads 214 of the fourth semiconductor die 210.

Figure 12:
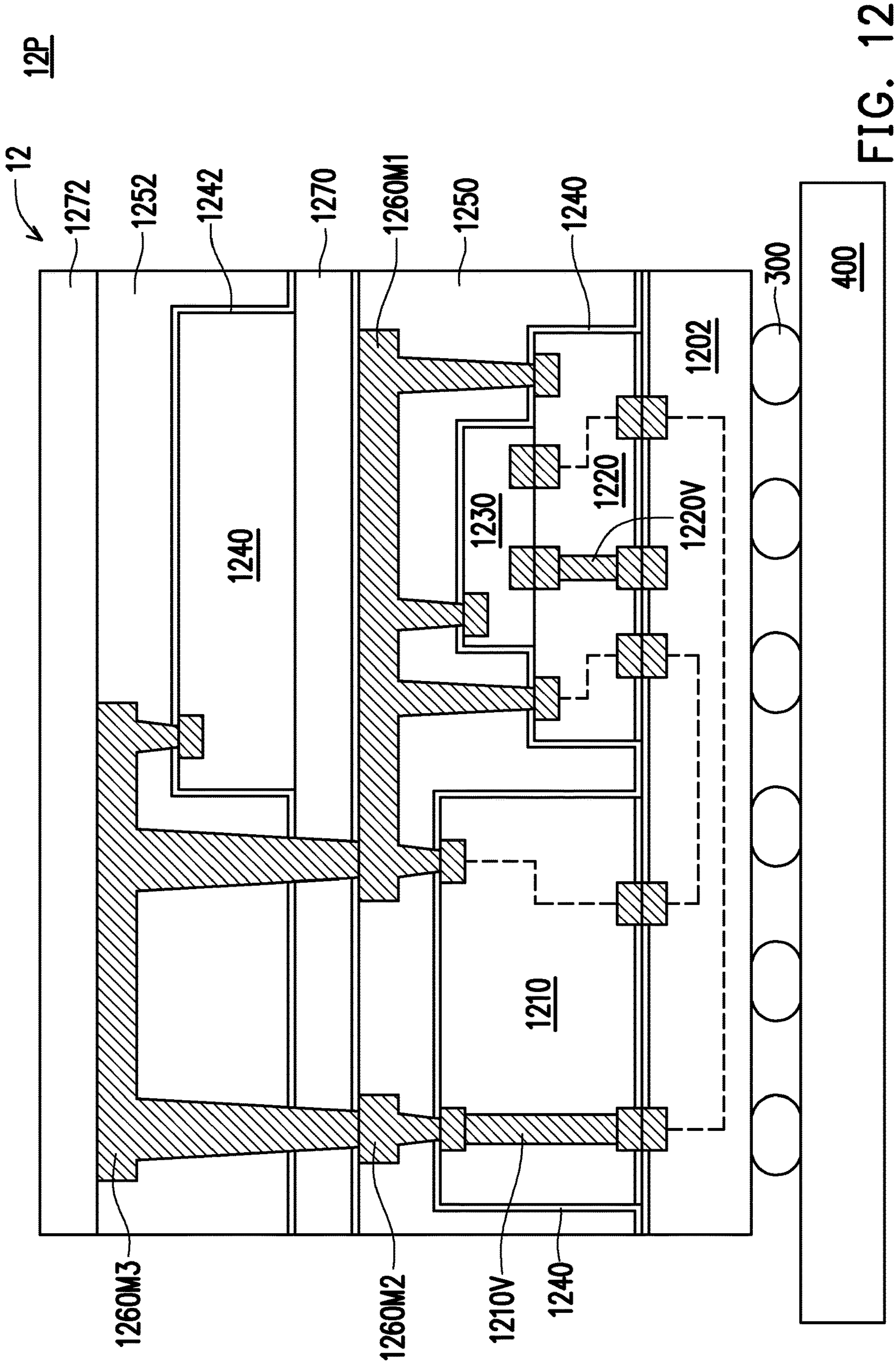
FIG. 12 is a schematic cross-sectional view of a semiconductor package structure having interlink structures in accordance with some embodiments of the present disclosure.

FIG. 12 is a schematic cross-sectional view of a semiconductor package structure having interlink structures in accordance with some embodiments of the present disclosure. In some embodiments, referring to FIG. 12, the semiconductor package structure 12P includes a package unit structure 12 similar to the package structure 10 as illustrated in FIG. 10 and FIG. 11. Referring to FIG. 12, a first die 1210 and a second die 1220 are disposed on the substrate 1202 and bonded to the substrate 1202, and the first die 1210 and the second die 1220 disposed on the substrate 1202 are arranged side by side but are spaced apart from each other. In some embodiments, a third die 1230 is disposed on and bonded to the second die 1220. In some embodiments, the first, second and third dies 1210, 1220, 1230 are conformally covered by a dielectric layer 1240. In some embodiments, interlink structures 1260M1 and 1260M2 are embedded in the first encapsulant 1250, and the interlink structures 1260M1 and 1260M2 are connected to the contact pads of the first, second and third dies 1210, 1220, 1230 and are electrically connected to the substrate 1202. As seen in FIG. 12, the semiconductor package structure 12P includes a fourth die 1240 disposed on a protection layer 1270 covering the first encapsulant 1250 and the interlink structures 1260M1 and 1260M2, and another dielectric layer 1242 conformally covering the fourth die 1240 and the protection layer 1270. In some embodiments, the interlink structure 1260M3 embedded in the second encapsulant 1252 are connected to the contact pad of the fourth die 120 and are connected to the underlying interlink structure 1260M1 and 1260M2.

In some embodiments, the first, second, third and fourth dies 1210, 1220, 1230, 1240 may be or include a logic die, a memory die or a specific application die such as a system-on-a-chip (SoC) die or an application specific integrated circuit (ASIC) die. In some embodiments, the first and second dies 1210, 1220 each includes a memory die such as a DRAM die or SRAM die, and the first and second dies 1210, 1220 each includes one or more through vias 1210V and 1220V. In some embodiments, the third die 1230 includes a logic die and the fourth die 1240 includes a power management IC (PMIC) die. In some embodiments, the semiconductor dies 1210, 1220, 1230, 1240 are of different sizes and different thickness (or heights). In one embodiment, the first die 1210 is a DRAM die having a thickness of about 50 microns to about 100 microns, the second die 1220 is a memory cube die having a thickness of about 20 microns to about 40 microns, the third die 1230 is a logic die having a thickness of about 3 microns to about 5 microns, and the fourth die 1240 is a PMIC die having a thickness of about 20 microns to about 30 microns.

In some embodiments, as seen in FIG. 12, the structure 12 is further connected to a circuit substrate 400 through connectors 300 according to some embodiments of the disclosure. For example, the circuit substrate 400 may be a motherboard, a flexible laminated circuit board, a printed circuit board, or the like. In some embodiments, the connectors 300 disposed on the top surface of the circuit substrate 400 and between the substrate 1202 and the circuit substrate 400 may be or include solder balls, ball grid array (BGA) balls, controlled collapse chip connection (C4) bumps, metal posts, micro bumps, or combination thereof.

The interlink structures as demonstrated and described in the above embodiments are applicable for various types of packages and the layout and design of the interlink structures may be modified based on the electrical requirements of the products.

In accordance with some embodiments of the present disclosure, a semiconductor package is disclosed. The semiconductor package includes a substrate, a first die and a second die disposed on the substrate, a resistant layer, an encapsulant and an interlink structure. The first die is located beside and spaced apart from the second die, and the first die has a first thickness larger than a second thickness of the second die. The resistant layer is disposed on the first and second dies and conformally covers the first and second dies. The encapsulant is disposed on the resistant layer and wraps around the first and second dies. The interlink structure is disposed above the first and second dies and embedded in the encapsulant, and the interlink structure is electrically connected with the first and second dies. The interlink structure includes a first via portion vertically extending through the encapsulant and connected to the first die, a second via portion extending vertically through the encapsulant and connected to the second die, and a routing line portion disposed on and connected with the first and second via portions, and the first via portion is shorter than the second via portion.

In accordance with some embodiments of the present disclosure, a semiconductor package is disclosed. The semiconductor package includes a substrate, a first die, a second die, a first dielectric resistant layer, a first encapsulant and a first interlink structure. The first die is disposed on the substrate, and the second die is disposed on the first die and over the substrate. A span of the first die is larger than a span of the second die, and the first die has a first thickness larger than a second thickness of the second die. The first dielectric resistant layer is disposed on the first and second dies and conformally covers the first and second dies. The first encapsulant is disposed on the first dielectric resistant layer and covers and wraps around the first and second dies. The first interlink structure is disposed above the first and second dies and embedded in the first encapsulant, and the first interlink structure is electrically connected with the first and second dies. The first interlink structure includes a first via portion vertically extending through the first encapsulant and connected to the first die, and a second via portion extending vertically through the first encapsulant and connected to the second die, and the first via portion is longer than the second via portion.

In accordance with alternative embodiments of the present disclosure, a method of fabricating a semiconductor package includes at least the following steps. A substrate is provided. A substrate is provided. A first die of a first thickness and a second die of a second thickness are disposed on the substrate. The first thickness is larger than the second thickness. A resistant dielectric layer is formed over the substrate and conformally covers the first and second dies. An encapsulant is formed on the resistant dielectric layer covering and wrapping the first and second dies. A first via opening is formed in the encapsulant corresponding to a portion of the first die and a second via opening is formed in the encapsulant corresponding to a portion of the second die. A first depth of the first via opening is smaller than a second depth of the second via opening. A trench opening is formed in the encapsulant. The trench opening is joined with the first and second via openings to form a dual damascene opening in the encapsulant. A metal material is formed over the encapsulant and fills the dual damascene opening. A portion of the metal material above the encapsulant is removed to form an interlink structure in the dual damascene opening and connected to the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a substrate;

a first die and a second die disposed on the substrate, wherein the first die is located beside and spaced apart from the second die, and the first die has a first thickness larger than a second thickness of the second die;

a resistant layer, disposed on the first and second dies and conformally covering the first and second dies;

an encapsulant, disposed on the resistant layer and wrapping around the first and second dies; and an interlink structure, disposed above the first and second dies and embedded in the encapsulant, and electrically connected with the first and second dies, wherein the interlink structure includes a first via portion vertically extending through the encapsulant and connected to the first die, a second via portion extending vertically through the encapsulant and connected to the second die, and a routing line portion disposed on and connected with the first and second via portions, and the first via portion is shorter than the second via portion.

2. The package according to claim 1, wherein the interlink structure is disposed within a dual damascene opening entrenched in the encapsulant, and a liner pattern is sandwiched between the interlink structure and the dual damascene opening.

3. The package according to claim 2, wherein a material of the interlink structure includes aluminum (Al), copper (Cu), tungsten (W), cobalt (Co), or alloys thereof, a material of the resistant layer includes silicon nitride, and a material of the liner pattern includes titanium (Ti), tantalum (Ta), Cu, titanium nitride or tantalum nitride.

4. The package according to claim 1, wherein the first via portion extends vertically extending through the encapsulant and through the resistant layer and is directly connected to a first contact pad of the first die, and the second via portion extends vertically extending through the encapsulant and through the resistant layer and is directly connected to a second contact pad of the second die.

5. The package according to claim 1, further comprising a third die stacked on the second die and electrically connected with the second die, and the resistant layer conformally covers the third die.

6. The package according to claim 5, wherein the interlink structure further comprises a third via portion connected to the routing line portion, and the third via portion vertically extends through the encapsulant and through the resistant layer, and the third via portion is directly connected to a third contact pad of the third die.

7. The package according to claim 6, wherein the third via portion is shorter than the second via portion.

8. The package according to claim 1, further comprising a protection layer partially covering the encapsulant and the interlink structure.

9. A semiconductor package, comprising:

a substrate;

a first die disposed on the substrate;

a second die, disposed on the first die and over the substrate, wherein a span of the first die is larger than a span of the second die, and the first die has a first thickness larger than a second thickness of the second die;

a first dielectric resistant layer, disposed on the first and second dies and conformally covering the first and second dies;

a first encapsulant, disposed on the first dielectric resistant layer and covering and wrapping around the first and second dies; and a first interlink structure, disposed above the first and second dies and embedded in the first encapsulant and electrically connected with the first and second dies, wherein the first interlink structure includes a first via portion vertically extending through the first encapsulant and connected to the first die, and a second via portion extending vertically through the first encapsulant and connected to the second die, and the first via portion is longer than the second via portion.

10. The package according to claim 9, further comprising:

a protection layer, disposed on the first encapsulant and the first interlink structure;

a third die, disposed on the protection layer and above the first and second dies and disposed over the first encapsulant and the first interlink structure;

a second dielectric resistant layer, disposed on the third die and conformally covering the third die;

a second encapsulant, disposed on the second dielectric resistant layer and covering and wrapping around the third die; and a second interlink structure, disposed above the first and second dies and embedded in the second encapsulant and electrically connected with the third die, wherein the second interlink structure includes a third via portion vertically extending through the second encapsulant and connected to the third die, and a fourth via portion vertically extending through the second encapsulant and the protection layer and connected to the first interlink structure, and the third via portion is shorter than the fourth via portion.

11. The package according to claim 10, wherein the first, second and third dies are electrically connected through the first and second interlink structures.

12. The package according to claim 10, wherein the third via portion extends vertically extending through the second encapsulant and through the second dielectric resistant layer and is directly connected to a third contact pad of the third die, and the fourth via portion extends vertically extending through the second encapsulant, through the second dielectric resistant layer and through the protection layer, and is directly connected to the first interlink structure.

13. The package according to claim 10, wherein the first interlink structure further comprises a line portion connecting the first and second via portions, and the fourth via portion is connected to the line portion of the first interlink structure.

14. The package according to claim 13, wherein the first interlink structure is an integral piece made of a same metal material.

15. The package according to claim 9, wherein the first via portion extends vertically extending through the first encapsulant and through the first dielectric resistant layer and is directly connected to a first contact pad of the first die, and the second via portion extends vertically extending through the first encapsulant and through the first dielectric resistant layer and is directly connected to a second contact pad of the second die.

16. A semiconductor package, comprising:

a substrate;

a first die and a second die disposed on the substrate, wherein the first die is located beside and spaced apart from the second die, and the first die has a first thickness different from a second thickness of the second die;

a resistant layer, disposed on the first and second dies and conformally covering the first and second dies;

an encapsulant, disposed on the resistant layer and wrapping around the first and second dies; and an interlink structure, disposed above the first and second dies and embedded in the encapsulant, and electrically connected with the first and second dies, wherein the interlink structure includes a first via portion vertically extending through the encapsulant and connected to the first die, a second via portion extending vertically through the encapsulant and connected to the second die, and a routing line portion disposed on and connected with the first and second via portions, a first dimension of the first via portion in a vertical thickness direction is different from a second dimension of the second via portion in the vertical thickness direction.

17. The package according to claim 16, further comprising a liner pattern sandwiched between the interlink structure and the encapsulant.

18. The package according to claim 17, wherein a metallic material of the interlink structure includes aluminum (Al), copper (Cu), tungsten (W), cobalt (Co), or alloys thereof, and a material of the liner pattern includes titanium (Ti), tantalum (Ta), Cu, titanium nitride or tantalum nitride.

19. The package according to claim 16, wherein a material of the resistant layer is different from a material of the encapsulant.

20. The package according to claim 19, wherein the first via portion extends vertically extending through the encapsulant and through the resistant layer and is directly connected to a first contact pad of the first die, and the second via portion extends vertically extending through the encapsulant and through the resistant layer and is directly connected to a second contact pad of the second die.

* * * * *